United States Patent [19]
Nistler et al.

[11] Patent Number: 6,083,272
[45] Date of Patent: Jul. 4, 2000

[54] METHOD OF ADJUSTING CURRENTS ON A SEMICONDUCTOR DEVICE HAVING TRANSISTORS OF VARYING DENSITY

[75] Inventors: John L. Nistler, Martindale; Derick J. Wristers, Austin, both of Tex.

[73] Assignee: Advanced Micro Devices, Inc., Sunnyvale, Calif.

[21] Appl. No.: 08/874,791

[22] Filed: Jun. 13, 1997

[51] Int. Cl.[7] .................................................. G06F 17/50
[52] U.S. Cl. .............................. 716/4; 324/713; 438/18; 257/48
[58] Field of Search .................................... 364/488, 489, 364/490; 438/303, 289, 18; 395/500.05; 257/48; 702/23, 64, 117, 118, 137; 324/713

[56] References Cited

U.S. PATENT DOCUMENTS

| | | | |
|---|---|---|---|
| 5,241,497 | 8/1993 | Komarek | 365/104 |
| 5,340,700 | 8/1994 | Chen et al. | 430/312 |
| 5,401,982 | 3/1995 | King et al. | 257/59 |
| 5,637,512 | 6/1997 | Miyasaka et al. | 438/166 |
| 5,650,979 | 7/1997 | Komarek et al. | 365/233.5 |
| 5,677,867 | 10/1997 | Hazani | 365/185 |
| 5,703,382 | 12/1997 | Hack et al. | 257/72 |
| 5,733,812 | 3/1998 | Ueda et al. | 438/289 |
| 5,789,780 | 8/1998 | Fulford, Jr. et al. | 257/344 |
| 5,789,955 | 8/1998 | Scheraga | 327/170 |
| 5,863,824 | 1/1999 | Gardner et al. | 438/303 |

OTHER PUBLICATIONS

Venkatesan et al "Device Drive Current Degradation Observed With Retrograde Channel Profiles," IEEE, pp. 17.2.1–17.2.4, Jan. 1995.

Liebmann et al., *Understanding Across Chip Line Width Variation: The First Step Toward Optical Proximity Correction*, Paper 3051–05, Session 2, (undated) p. 129. No date.

Tritchkov et al., *Optical Proximity Effects Correction at 0.25 μm Incorporating Process Variations in Lithography*, Paper 3051–27, Session 7, (1994), p. 148–149.

Fujimoto et al., *Comparison between Optical Proximity Effect of Positive and Negative Tone Patterns in KrF Lithography*, Paper 3051–28, Session 7, (undated), p. 150. No date.

Yasuzato et al., *Optical proximity correction of alternating phase shift masks for 0.81 μm KrF lithography*, Paper 3051–29, Session 7, (1995), p. 151.

Misaka et al., *Optical Proximity Correction in DRAM Cell Using a New Statistical Methodology*, Paper 3051–30, Session 7, (undated), pt. 152. No date.

*Primary Examiner*—Paul R. Lintz
*Assistant Examiner*—Vuthe Siek

[57] ABSTRACT

A method of adjusting drive currents on a semiconductor device having transistors of various densities is disclosed. Consistent with the invention, off-state currents and drive currents associated with non-dense transistors on a first semiconductor device formed by a fabrication process are determined. Off-state currents associated with dense transistors on the first semiconductor device are also determined. Using the determined off-state and drive currents associated with the non-dense transistors and the off-state currents associated with the dense transistors on the first semiconductor device, drive currents associated with the dense transistors on the first semiconductor device are estimated. One or more parameters of the fabrication process are then adjusted based on the estimated drive currents of the dense transistors on the first semiconductor device in order to calibrate drive currents of dense transistors with drive currents of non-dense transistors on semiconductor devices formed using the fabrication process. The drive currents of the dense and non-dense transistors may, for example, be matched to within about 3 microamps.

24 Claims, 7 Drawing Sheets

FIG. 1

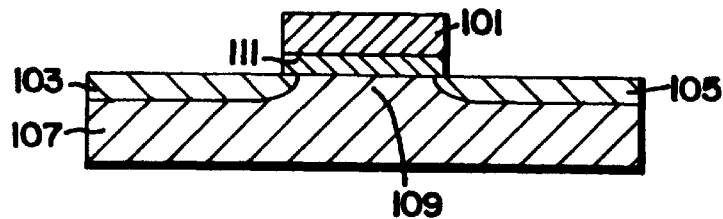

FIG. 2

```
┌─────────────────────────────────────┐
│ Determine Drive Currents Associated │─202
│     with Non-dense Transistors      │
└─────────────────────────────────────┘
                  │
                  ▼
┌─────────────────────────────────────┐
│ Determine Off-state Current Associated with │─204
│     Dense and Non-Dense Transistors         │
└─────────────────────────────────────┘
                  │
                  ▼
┌─────────────────────────────────────┐
│ Determine Polygate Widths Associated with │─206
│    Dense and Non-Dense Transistors         │
└─────────────────────────────────────┘
                  │
                  ▼
┌─────────────────────────────────────┐
│ Determine Drive Currents Associated with Dense │
│    Transistors Using Drive Current             │─208
│       and Off-State Current Data               │
└─────────────────────────────────────┘
                  │
                  ▼
        ┌──────────────────────┐
        │ Adjust Fabrication Process to │─210
        │   Adjust Drive Currents      │
        └──────────────────────┘
```

METHOD OF ADJUSTING CURRENTS ON A SEMICONDUCTOR DEVICE HAVING TRANSISTORS OF VARYING DENSITY

FIELD OF THE INVENTION

The present invention is directed generally to a semiconductor device and method of manufacture thereof, and more particularly to a method of adjusting drive currents on a semiconductor device having transistors of varying density.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101 (which is typically formed of polysilicon and will also be referred to herein as a polygate), which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a doping type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. The current flow through the channel region is typically referred to as the source-drain current. This type of device is commonly referred to as a MOS field-effect-transistors (MOSFET).

Semiconductor devices, like the one described above, are used in large numbers to construct most modern electronic devices. A typical semiconductor device often includes a large number of transistors having different densities. For example, one region of the device may be more tightly packed than another and thus have higher density transistors. In order to increase the capability of such electronic devices, it is desirable to increase the speeds at which these devices operate.

One typical step for optimizing the speed of a semiconductor device is matching the drive currents of the various transistors. Semiconductor devices, however, typically include transistors of various density, some of which are so dense that the drive currents for the transistor cannot be measured directly. Accordingly, other techniques have been developed in an attempt to match drive currents.

One conventional technique which attempts to match the drive currents of transistors on a chip generally includes measuring the in-line widths of the polygates of the transistors on a test chip and determining the difference (often referred to as Poly $\Delta W$ or the critical dimension) between these measured polygate widths and the polygate widths specified by the design specifications of the device. Under the assumption that the relationship between the drive current and the critical dimension is the same for transistors of different density, the process used to form the test chip is adjusted so that the critical dimensions of transistors on subsequently formed chips are equal. This is typically done by changing the mask used for polygate etching.

SUMMARY OF THE INVENTION

Generally, the present invention relates to a method of adjusting drive currents on a semiconductor device having transistors of varying density. Using the method of the present invention, drive currents on dense and non-dense transistors can be more accurately matched and device performance improved as compared to devices formed using conventional techniques.

Consistent with the present invention, off-state currents and drive currents associated with non-dense transistors on a first semiconductor device formed by a fabrication process are determined. Off-state currents associated with dense transistors on the first semiconductor device are also determined. Using the determined off-state and drive currents associated with the non-dense transistors and the off-state currents associated with the dense transistors on the first semiconductor device, drive currents associated with the dense transistors on the first semiconductor device are estimated. One or more parameters of the fabrication process are then adjusted based on the estimated drive currents of the dense transistors on the first semiconductor device in order to calibrate drive currents of dense transistors with drive currents of non-dense transistors on semiconductor devices formed using the fabrication process.

In accordance with a further aspect of the invention, a semiconductor device including dense transistors having drive currents and non-dense transistors having drive currents is provided. The drive currents of the dense and non-dense transistors may, for example, be matched to within about 3 microamps.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 1 illustrates components of a MOS semiconductor device;

FIG. 2 is a flow chart illustrating an exemplary process in accordance with one embodiment of the invention;

FIGS. 7–9A and 9B illustrate one exemplary process in accordance with an embodiment of the invention.

Figure 3:
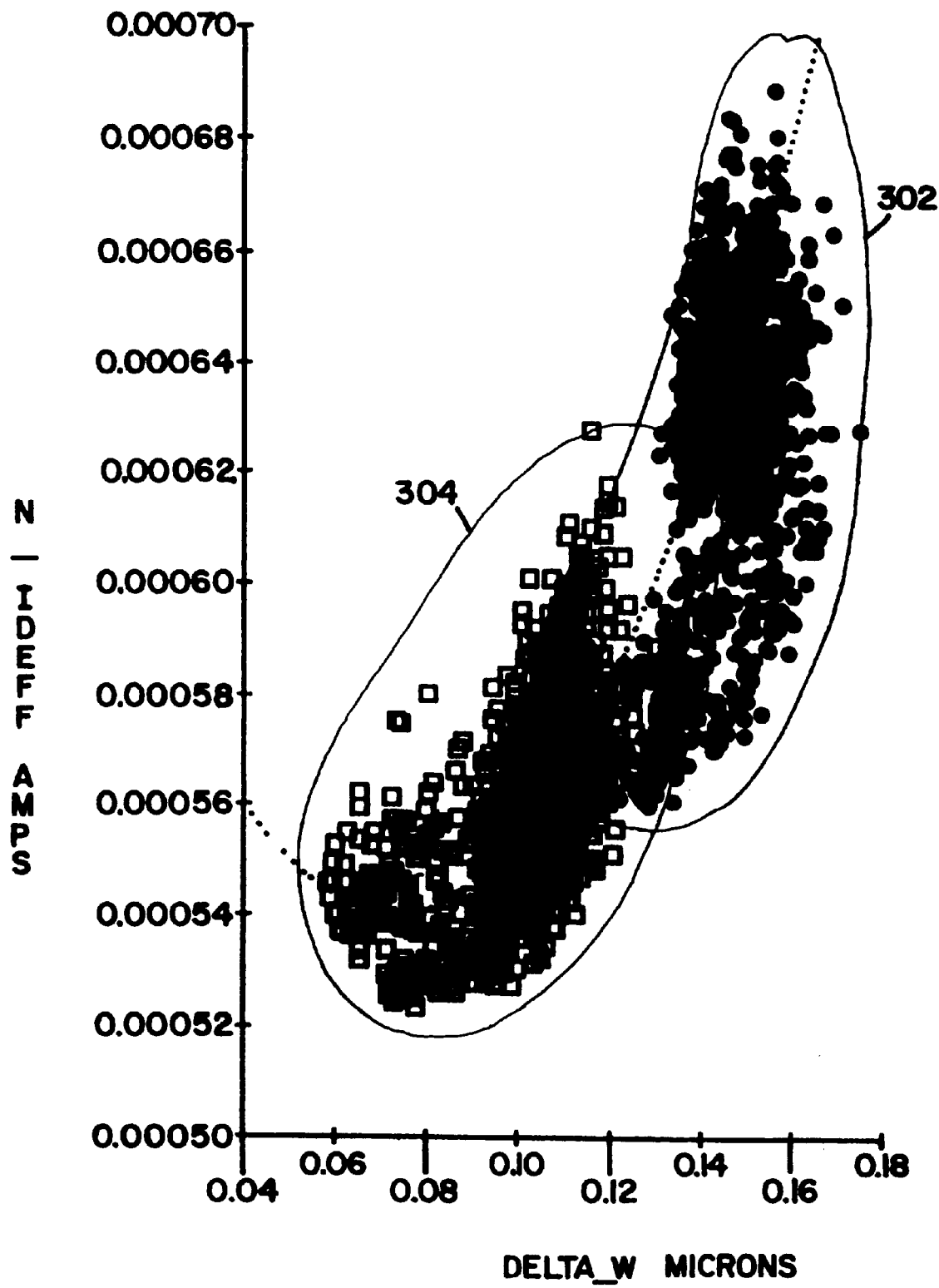
FIG. 3 is a graph illustrating drive currents as a function of Poly $\Delta W$ for dense and non-dense transistors.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices having transistors of various densities. The invention has been found to be particularly advantageous in application environments where it is desirable to accurately match the drive currents of transistors of varying density. While the present invention is not so limited, an appreciation of various aspects of the invention is best gained through a discussion of examples of processes used to form such semiconductor devices.

Transistors having sufficiently high density so that their active regions cannot be contacted for measuring drive currents will be referred to herein as dense transistors, while other, less dense transistors having accessible active regions will be referred to herein as non-dense transistors. Typically, it becomes difficult to contact active regions of transistors at pitches of about 1 micron or less. However, this threshold pitch may vary depending on the semiconductor structure and the process used for contacting the transistors.

As discussed above, conventional techniques generally match the critical dimensions or Poly ΔW of the transistors on a device and assume that by matching the critical dimensions, drive currents of the various density transistors are matched. It has, however, been determined by the inventors of the present invention that matching of the critical dimensions using conventional techniques fails to account for a number of other factors which affect drive currents and which can cause the drive currents to vary between transistors of different densities. Such factors include, for example, variations in heat dissipation or variations in dopant implantation between transistors of different densities. For example, non-dense transistors typically have relatively fewer surrounding structures, such as metal layers, as compared to dense transistors. As a result, non-dense transistors typically dissipate less heat and are subject to more diffusion of dopants. Another factor contributing to drive current variation between various density transistors is shadowing caused by surrounding structures during doping implant in dense transistor regions. In accordance with the invention, a methodology is provided which more accurately accounts for factors which affect the drive currents of transistors on a semiconductor device and, in doing so, provides increased device performance.

With reference to FIG. 2, a flow diagram illustrating an exemplary process for fabricating semiconductor devices having transistors of varying density in accordance with a particular embodiment of the present invention will be described. Generally, the process calls for determining the Poly ΔW of and the drain-source current at different device states for the transistors oil a first semiconductor device formed by a fabrication process. Using this data, one or more parameters of the fabrication process which may be adjusted to calibrate the drive currents on the dense or non-dense transistors are determined. These parameters of the fabrication process may then be adjusted so that subsequently fabricated semiconductors can, for example, have more accurately matched drive currents.

Block 202 represents determining the drive currents of non-dense transistors on a semiconductor device formed according to a fabrication process. For ease of illustration, this semiconductor device will be referred to as a test wafer. However, it should be appreciated that the invention is not so limited.

The drive currents may, for example, be the saturated source-drain current ($Id_s$) or the effective source-drain current ($Id_{eff}$). The source-drain current $Id_s$ of a non-dense transistor may be determined by measuring the source-drain current of the transistor while applying a known voltage to the gate and the source of the transistor. Typically, the applied gate voltage and source voltage are the maximum voltage seen by the device. For example, for a transistor operating at 3.1±2 volts (V), the gate and source are typically held at 3.3 V. The effective drive current $Id_{eff}$ of the transistor may be determined by dividing the source-drain current $Id_s$ by the transistor width. The transistor width may, for example, be the length of the transistor polygate over the active area of a device. Determination of transistor width may be done using well-known techniques.

As indicated at block 204, off-state currents for both dense and non-dense transistors on the test wafer are determined. The off-state current $Id_{off}$ of a non-dense transistor may be determined by measuring the source-drain current of the transistor while applying a known voltage to the drain of the transistor and reverse biasing the gate of the transistor. The applied drain voltage may, for example, be the maximum device voltage.

With dense transistors, the actual $Id_{off}$ for each transistor typically cannot be physically measured. For example, dense transistors usually come in sets of 3 or more transistors where only the source/drain regions of the end transistors may be physically contacted for measurements. For these transistors, typically an off-state source-drain current $Id_{off}$ for a particular transistor is determined. This may, for example, involve applying known voltages to the gates of the transistor set in order to turn off the particular transistor and turn on the other transistors, applying a known voltage to a contacted drain region, and measuring the source-drain current between the contacted source and drain regions of the transistor set. Typically, this involves reverse biasing the particular transistor and applying the maximum device voltage to the other transistors, and applying the maximum device voltage to the contacted drain of the transistor set. As the voltage at the source and drain of the particular transistor is not the same as the voltages applied to the contacted source and drain regions at the ends of the transistor set, the off-state source-drain current $Id_{off}$ of the particular transistor is determined by adjusting the measured source-drain current to account for the body effect voltage drop across the other transistors in the set. The particular transistor may, for example, be a central transistor in a transistor set.

The difference between the actual width of the polygates on the test wafer and the designed width of the polygates (i.e., the Poly ΔW) is then determined, as indicated in block 208. This may, for example, include measuring the width of a resistor structure drawn at the same dimension as the polysilicon gate and determining the difference between the width of this structure and the design width of the associated polygate(s).

It should be appreciated that a typical semiconductor device may have transistors at a number of different pitches. For example, the pitches on a semiconductor may range from 0.35 microns to submicron level. While the currents measured at blocks 202 and 204 and the line widths measured at block 206 may be performed on each of the transistors (or transistor sets in the case of dense transistors), it would be sufficient to take these measurements for a representative sample of transistors. For example, a suitable number of transistors at each pitch may be measured to generate a 95% confidence level in the measured data.

Using the current data and the Poly $\Delta W$ data determined at blocks 202–206, drive currents for dense transistors are determined, as indicated at block 208. This may, for example, include generating $Id_{off}$ vs. $Id_{eff}$ curves for various pitches of non-dense transistors, $Id_{eff}$ vs. Poly $\Delta W$ curves for the various pitches of non-dense transistors, and $Id_{off}$ vs. Poly $\Delta W$ curves for both the dense and non-dense transistors at various pitches, and extrapolating from these curves, the relationship between $Id_{eff}$ and Poly $\Delta W$ or the relationship between $Id_{eff}$ and $Id_{off}$ for dense transistors. Using the relationship bewteen $Id_{eff}$ and Poly $\Delta W$ for dense transistors, the Poly $\Delta W$ of dense transistors may be adjusted to affect a desired change in drive current $Id_{eff}$. This Poly $\Delta W$ adjustment may be made by modifying the polygate mask.

FIG. 3 is a graph showing drive currents $Id_{eff}$ as a function of Poly $\Delta W$ for dense and non-dense transistors. The data group 302 represents approximated $Id_{eff}$ data points for a measured Poly $\Delta W$ for dense transistors. Data group 304 represents measured $Id_{eff}$ current data as a function of poly $\Delta W$ for non-dense transistors. It can be seen that the data group 302 for dense transistors and the data group 304 for non-dense transistors do not lie on the same curve due to the factors which affect drive currents discussed above. In accordance with an exemplary embodiment of the present invention, the drive currents of the dense and non-dense transistors may be matched to increase device performance.

As indicated at block 210, one or more parameters of the fabrication process, used to form the test wafer, are adjusted in order to calibrate drive currents of dense transistors with drive currents of non-dense transistors on semiconductor devices formed using the fabrication process. The drive currents may, for example, be adjusted so that the drive currents of dense and non-dense transistors are closely matched. The adjustments to the one or more parameters of the fabrication process are based on the estimated drive currents of the dense transistors on the test wafer.

The parameters of the fabrication process which may be modified include, for example, the polygate mask, threshold voltage implants, source/drain implants, etc. In one embodiment, the Poly $\Delta W$'s of dense and/or non-dense transistors are adjusted by modifying the polygate mask used to create the polygates of the transistors. The mask may be modified using well-known techniques. In this manner, drive currents on semiconductor devices may be adjusted as desired. The amount of adjustment to Poly $\Delta W$'s (and thus the modification to the polygate mask) may, for example, be selected using the relationships between $Id_{eff}$ and Poly $\Delta W$ for dense and non-dense transistors, determined at Block 208.

Using the above process, drive currents on semiconductor devices having dense and non-dense transistors can be more closely matched than by using conventional techniques. As an example, using conventional techniques, the drive currents between dense and non-dense transistors can be matched to within about 70 microamps. In contrast, using the above process, drive currents on dense and non-dense transistors can be matched to less than 60 microamps. Though the difference in drive currents on a semiconductor chip can vary due to processing variations, in some embodiments of the invention, drive currents on dense and non-dense transistors can be matched to within about 3 microamps, for example. Further, the above process provides enhanced device performance. For example, the above process can increase the operating speed of a device by about 7 to 70 megahertz (MHz) as compared to conventionally fabricated devices.

Figure 4:
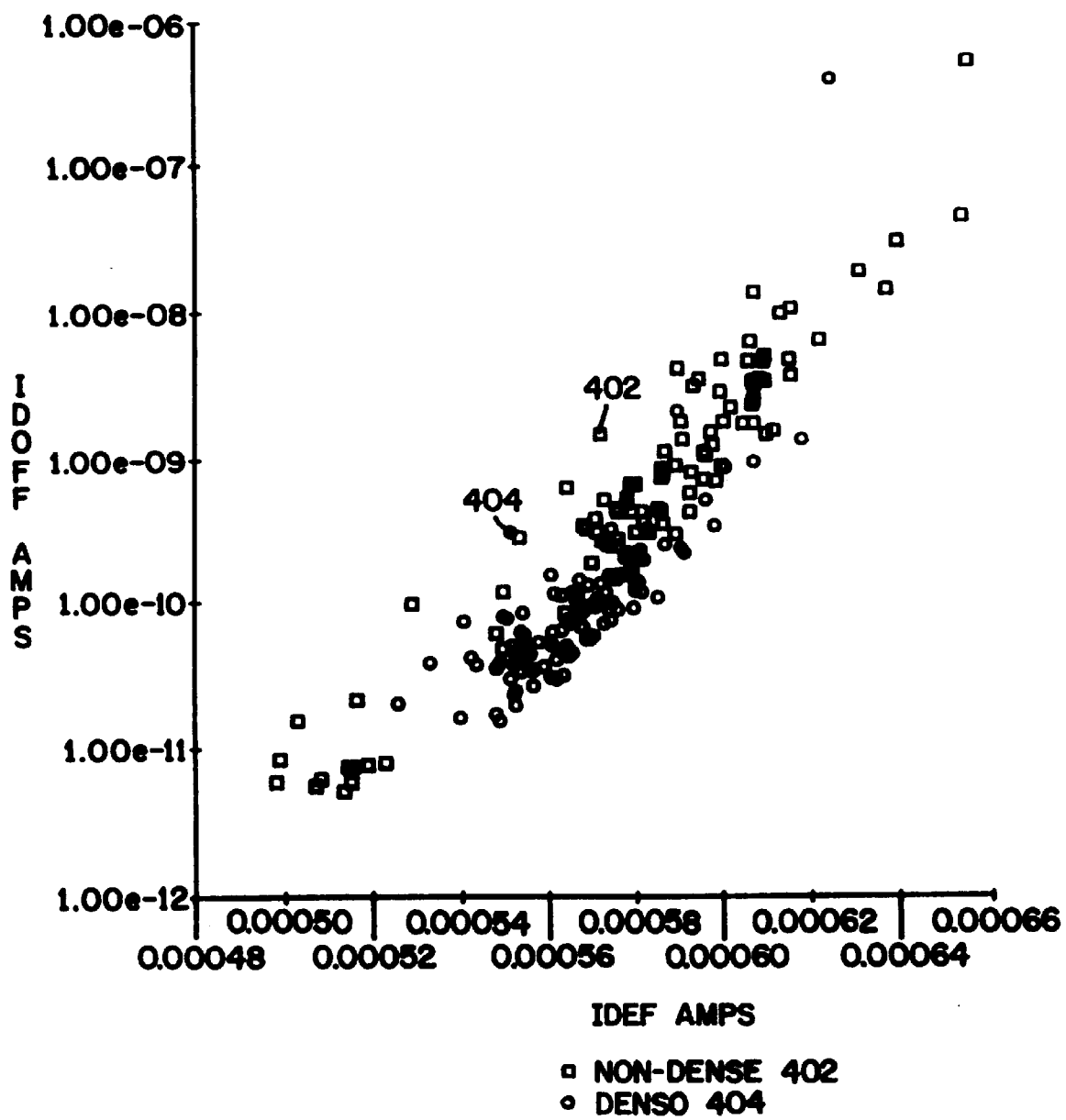
FIG. 4 is a graph showing off-state current versus drive current for an n-channel MOS (NMOS) device having transistors compensated using the invention.
Figure 5:
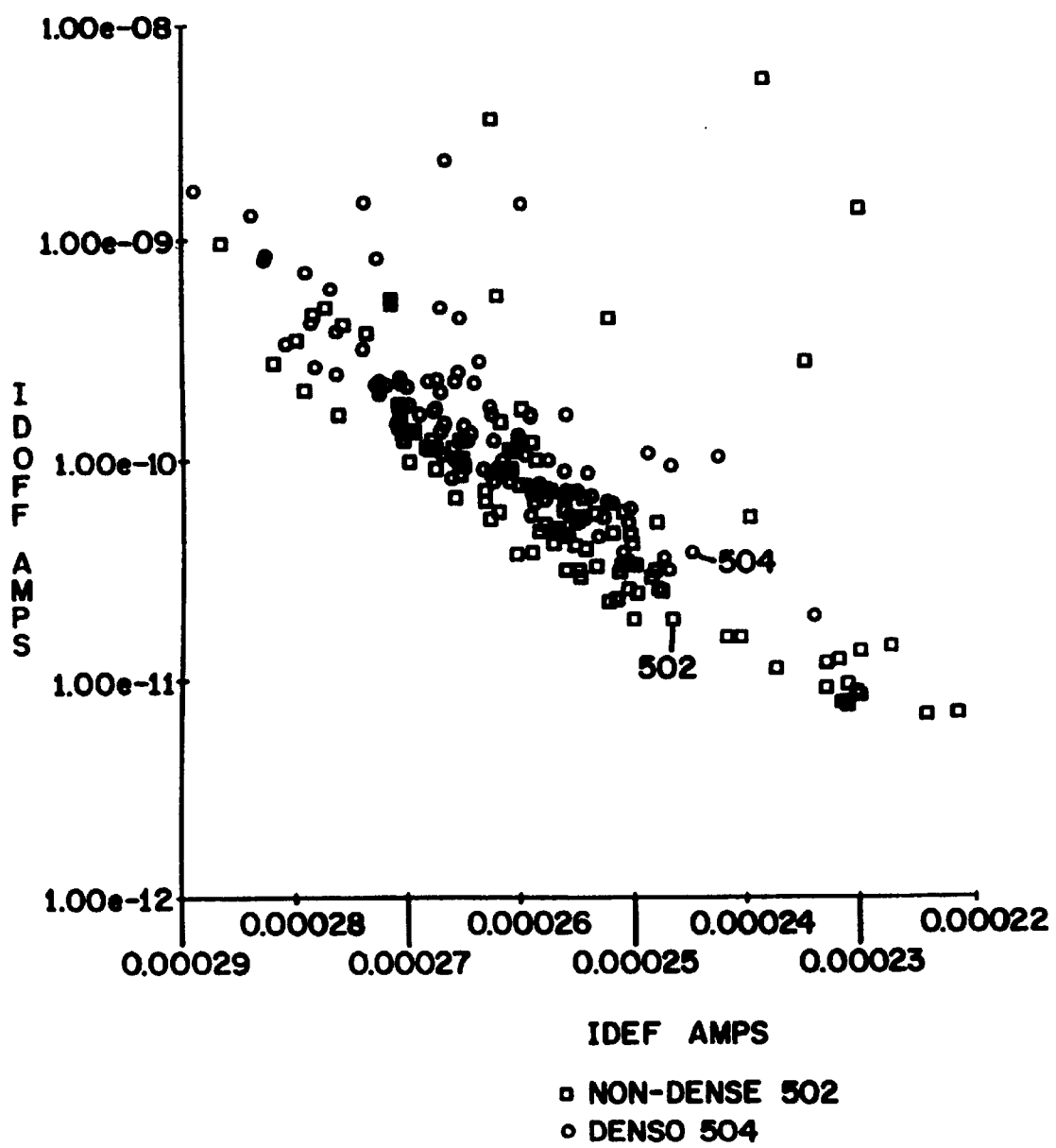
FIG. 5 is a graph showing off-state current versus drive current for an p-channel MOS (PMOS) device having transistors compensated using the invention.

FIG. 4 is a graph of off-state current versus drive current for an n-channel MOS (NMOS) device having non-dense and dense transistors which have been compensated using the above process to more accurately match the drive currents between the transistors. The data points for the non-dense transistors are indicated by blocks 402 and the data points for the dense transistors are indicated by circles 404. It can be seen that the median of the two distributions are within about 3 microamps. FIG. 5 is a graph of off-state current versus drive current for a p-channel MOS (PMOS) device having non-dense and dense transistors (represented by squares 502 and circles 502, respectively) having their drive currents matched using the above process.

Figure 6:
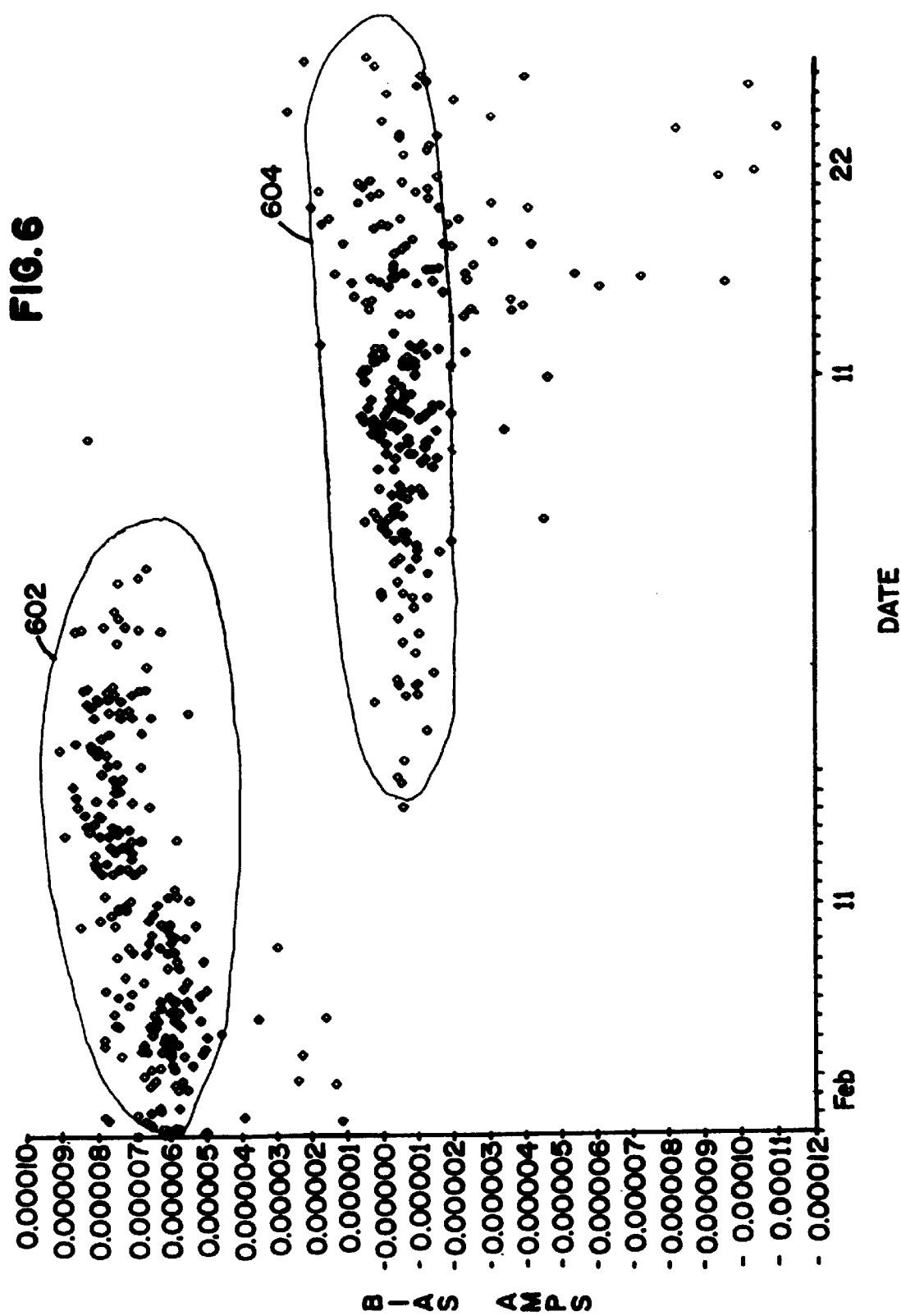
FIG. 6 illustrates the difference in drive currents between dense and non-dense transistors using the present invention as compared to conventional techniques.

FIG. 6 is a graph illustrating the improved device performance resulting from present invention. In particular, the figure illustrates the difference in drive currents between dense and non-dense transistors using conventional techniques and using the present invention. The Y axis represents the difference in drive currents ($\Delta Id_{eff}$) between dense transistors and non-dense transistors, and the X axis represents the time at which the measurement was done. Test grouping 602 shows the drive current difference between non-dense and dense transistors on semiconductor devices employing conventional techniques, while test grouping 604 illustrates the drive current difference using the above process. Data points lying outside of test groups 602 and 604 typically result from irregularities in the processing steps used to form the transistors. It can be seen that the difference in drive currents between the dense and non-dense transistors, using conventional techniques, is about 70 microamps, while the present invention can match drive currents to within about 3 microamps.

Further details of one exemplary process for determining matching drive currents between dense and non-dense transistors will be described with reference to FIGS. 7–9. Through optical simulation, isolated density transistors can be defined. This may be done using an optical stepper. For example, all transistor having a pitch greater than 6 times the wavelength of light used in an optical stepper having an NA between 0.48 and 0.6 and partial clearance of 0.4 to 0.6 may be defined as isolated.

$Id_{off}$ and Poly $\Delta W$ data is measured for transistors at various pitches. The $Id_{off}$ and Poly $\Delta W$ data is plotted linearly and a polynomial regression of degree 2 is fitted to the curve. Exemplary $Id_{off}$ vs. Poly $\Delta W$ curves are illustrated in FIG. 7. An error analysis may be done to verify to the 1st approximation that the universal curves for isolated, near-dense, and dense transistors are reasonably comparable. It is noted that the inventors have determined that the universal curves for varying pitch transistors plotted against their respective Poly $\Delta W$'s are not necessarily on the same curves. Accordingly, it is desirable to establish processes that are close enough so that the $Id_{off}$ vs. Poly $\Delta W$ curves can be used to adjust the dense transistors, since $Id_{eff}$ of dense transistors cannot be measured directly.

If a general polynomial fit to the $Id_{off}$ and Poly $\Delta W$ data is difficult, then an independent polynomial regression can be made for each type of transistor. Error analysis may then be performed by transposing, i.e., normalizing, each curve on top of each other to discern the amount of error in drive current prediction for the dense transistor bias correction to be determined. This establishes the error for design simulation purposes.

$Id_{off}$ vs. $Id_{eff}$ or $Id_{off}$ vs. $Id_s$ data curves are generated for all transistors with direct contact to the transistor source/drain regions of the transistor being measured. These curves may be fitted using a general polynomial fit or polynomial regression as discussed above. Exemplary $Id_{off}$ vs. $Id_{eff}$ curves are illustrated in FIG. 8. From these curves, an $\Delta Id_{eff}$ shift required to match median drive currents of the different contacted transistors is determined. Statistical variance in the curves may also be checked and statistically equivalent pitched transistors may be grouped together.

Figure 9A:
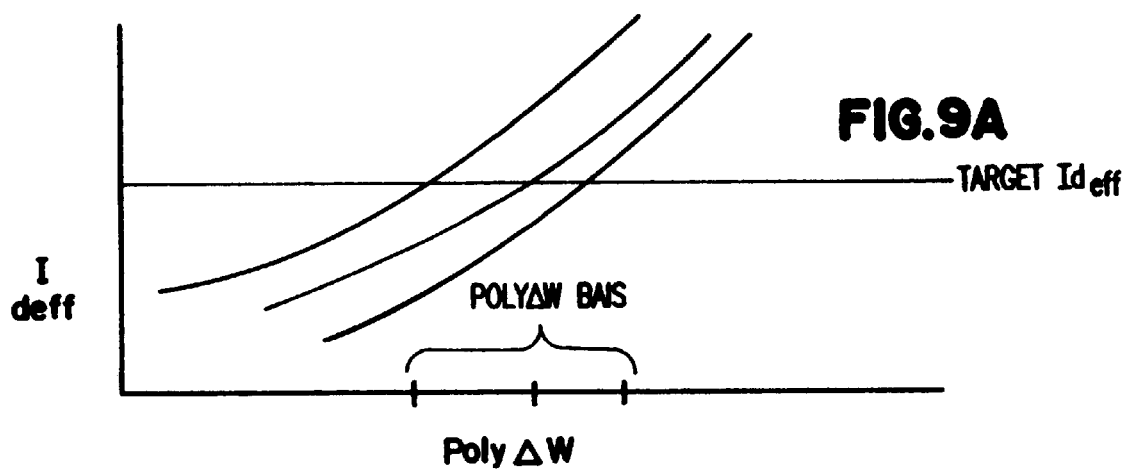

$Id_{eff}$ vs. Poly $\Delta W$ curves for the each statistically different pitch transistor group is generated with a polynomial regression of degree 2 fitted to the curve(s) Exemplary $Id_{eff}$ vs. Poly $\Delta W$ curves are illustrated in FIG. 9A. Using the polynomial fit of the $Id_{eff}$ vs. Poly $\Delta W$ data, the change in poly $\Delta W$ for obtaining matched drive currents can be calculated using the $\Delta Id_{eff}$ shift determined above. In this manner, drive current bias correction for contacted or non-dense transistors can be calculated.

Figure 7:
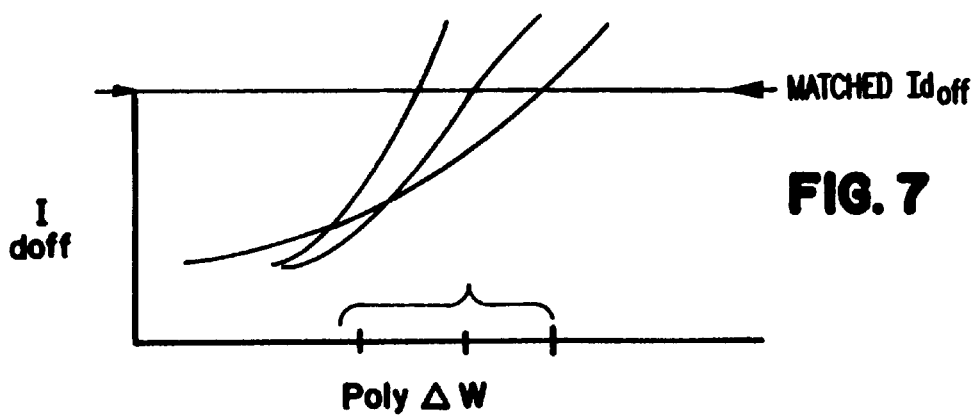
Figure 8:
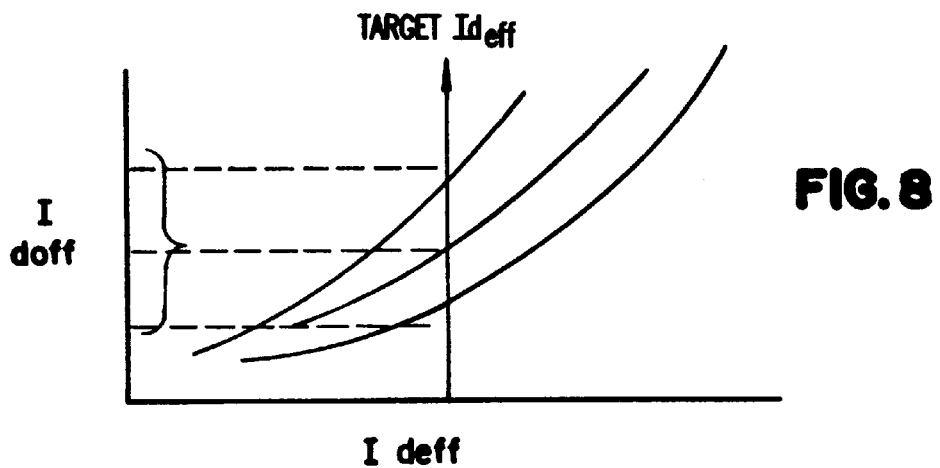
Figure 9B:
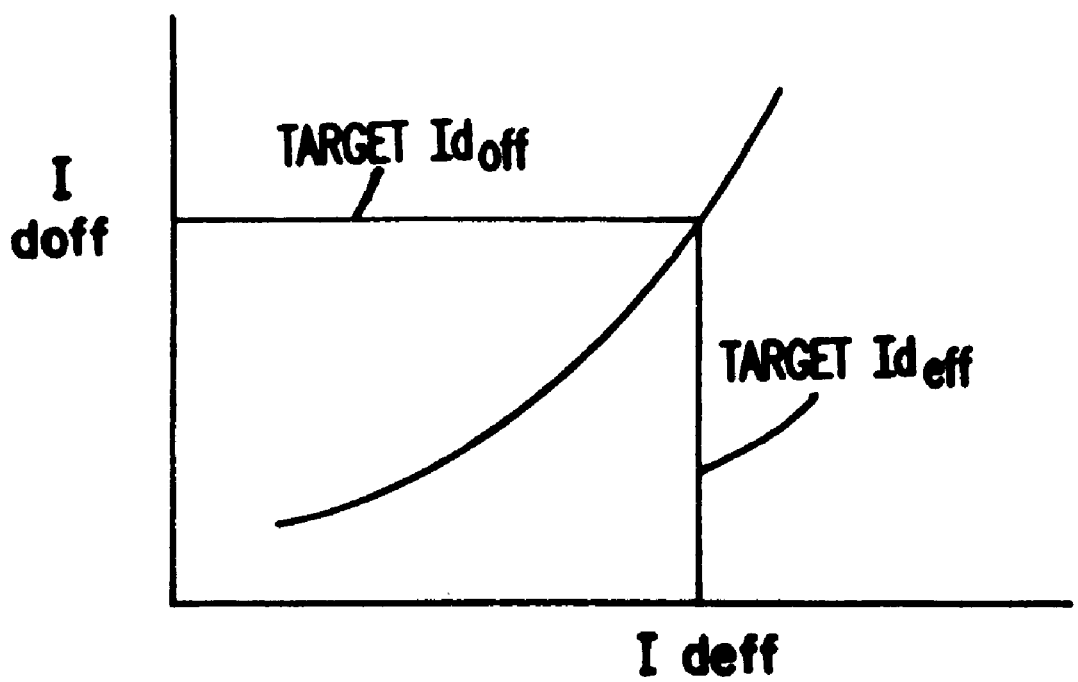

Since the drive currents of dense or non-contacted transistors cannot be measured directly, an extrapolation based on FIGS. 7 and 8 is performed. In particular, the $Id_{off}$ vs. $Id_{eff}$ curve (FIG. 9B) for the smallest pitch contacted transistor from FIG. 8 is used to determine an $Id_{off}$ associated with a target $Id_{eff}$. The $Id_{off}$ vs. Poly $\Delta W$ curves for dense and non-dense transistors (FIG. 7) can then be used to adjust the dense transistors, since the $Id_{eff}$ of dense transistors cannot be measured directly. In this case, from FIG. 7, the change in Poly $\Delta W$ for matching dense transistor $Id_{off}$ to the contacted transistor $Id_{off}$ is determined using the $Id_{off}$ associated with the $Id_{eff}$ target illustrated in FIGS. 8 and 9B.

As noted above the process described with reference to FIGS. 7–9B is provided by way of example and is not intended to limit the invention.

The present invention is applicable to fabrication of a number of different semiconductor devices having various density transistors. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A semiconductor fabrication method, comprising:
   determining off-state currents associated with non-dense transistors on a first semiconductor device formed by a fabrication process;
   determining drive currents associated with the non-dense transistors on the first semiconductor device;
   determining off-state currents associated with dense transistors on the first semiconductor device;
   estimating drive currents associated with the dense transistors on the first semiconductor device using the determined off-state and drive currents of the non-dense transistors and the off-state currents of the dense transistors on the first semiconductor device;
   adjusting one or more parameters of the fabrication process based on the estimated drive currents of the dense transistors on the first semiconductor device in order to calibrate drive currents of dense transistors with drive currents of non-dense transistors on semiconductor devices formed using the fabrication process.

2. The method of claim 1, further including forming a second semiconductor device using the fabrication process with the adjusted one or more parameters.

3. The method of claim 1, wherein determining the off-state currents associated with the non-dense transistors includes:
   applying a selected voltage to the drain of each non-dense transistor;
   reverse biasing the gate of each transistor; and
   measuring the source-drain current of each non-dense transistor.

4. The method of claim 3, wherein the applied drain voltage is the maximum device voltage.

5. The method of claim 1, wherein measuring off-state currents associated with the dense transistors includes:
   turning off a one transistor of a dense transistor set comprising at least two of the dense transistors and turning on the other transistors in the dense transistor set by applying selected voltages to the gates of the transistors in the set;
   applying a selected voltage to an accessible drain region of the dense transistor set;
   measuring the source-drain current between the accessible drain region and an accessible source region of the dense transistor set; and
   adjusting the measured source-drain current to account for voltage drop across the other transistors in the dense transistor set.

6. The method of claim 5, wherein the one transistor is a central transistor.

7. The method of claim 1, wherein determining drive currents associated with the non-dense transistors includes:
   applying a selected voltage to the gate of each non-dense transistor;
   applying a selected voltage to the source of each non-dense transistor; and
   measuring the source-drain current of each transistor.

8. The method of claim 7, wherein the applied gate voltage and source voltage is the maximum device voltage.

9. The method of claim 7, wherein determining drive currents associated with the non-dense transistors further includes dividing the measured source-drain current by the transistor width.

10. The method of claim 1, further including:
    measuring polygate widths of the non-dense and dense transistors; and
    determining a difference between the measured polygate widths and designed polygate widths;
    wherein estimating drive currents of the dense transistors includes using the difference between the measured polygate widths and designed polygate widths.

11. The method of claim 1, wherein the one or more parameters includes a polygate width.

12. The method of claim 1, wherein the drive currents are calibrated to be equal.

13. The method of claim 1, wherein the non-dense transistors include transistors having a pitch of greater than about 1 micron.

14. The method of claim 1, wherein the dense transistors include transistors having a pitch of less than about 1 micron.

15. The method of claim 1, wherein the non-dense transistors include transistors having a pitch of less than about 0.35 micron.

16. The method of claim 1, wherein the dense transistors include transistors for which direct measurement of the drive current is unobtainable.

17. A semiconductor device comprising:

dense transistors having drive currents; and non-dense transistors having drive currents;

wherein the difference between the drive currents of the dense and non-dense transistors is less than about 60 microamps.

18. The semiconductor device of claim 17, wherein the difference is about 3 microamps.

19. The semiconductor device of claim 17, wherein the dense transistors each have a critical dimension and the non-dense transistors each have a critical dimension; wherein the critical dimensions of each of the non-dense transistors is provided to differ from the critical dimensions of each of the dense transistors.

20. A semiconductor fabrication method for matching drive currents on semiconductor devices, comprising:

determining off-state currents associated with non-dense transistors on a test device formed by a fabrication process;

determining drive currents associated with the non-dense transistors on the test device;

determining off-state currents associated with dense transistors on the test device;

indirectly determining drive currents associated with the dense transistors on the test device using the determined off-state and drive currents of the non-dense transistors and the off-state currents of the dense transistors on the test device; and adjusting one or more parameters of the fabrication process based on the indirectly determined drive currents of the dense transistors on the test device in order to closely match drive currents of dense transistors with drive currents of non-dense transistors on subsequent semiconductor devices formed using the fabrication process.

21. The method of claim 20, further including forming a second semiconductor device using the adjusted fabrication process.

22. A semiconductor fabrication method for matching drive currents on semiconductor devices, comprising:

(a) determining off-state currents associated with non-dense transistors on a test device formed by a fabrication process;

(b) determining drive currents associated with the non-dense transistors on the test device;

(c) turning off a one dense transistor of a dense transistor set on the test device and turning on the other dense transistors in the dense transistor set by applying selected voltages to the gates of the transistors in the set;

(d) applying a selected voltage to an accessible drain region of the dense transistor set;

(e) measuring a source-drain current between the accessible drain region and an accessible source region of the dense transistor set;

(f) adjusting the measured source-drain current to account for voltage drop across the other transistors in the dense transistor set to obtain an off-state current for the one dense transistor;

(g) indirectly determining drive currents associated with the dense transistors on the test device using the determined off-state and drive currents of the non-dense transistors and the off-state currents of the dense transistors on the test device; and (h) adjusting one or more parameters of the fabrication process based on the indirectly determined drive currents of the dense transistors on the test device in order to closely match drive currents of dense transistors with drive currents of non-dense transistors on subsequent semiconductor devices formed using the fabrication process.

23. The method of claim 22, further comprising repeating steps (c) through (f) for each dense transistor in the dense transistor set to obtain an off-state current for each dense transistor.

24. The method of claim 22, further comprising repeating steps (c) through (f) for at least one additional dense transistor set.

* * * * *